United States Patent
Beunen et al.

(10) Patent No.: US 12,205,318 B2
(45) Date of Patent: Jan. 21, 2025

(54) DEEP LEARNING BASED SAMPLE LOCALIZATION

(71) Applicant: FEI Company, Hillsboro, OR (US)

(72) Inventors: Sven Beunen, Portland, OR (US); Scott Maclay, Hillsboro, OR (US)

(73) Assignee: FEI Company, Hillsboro, OR (US)

( * ) Notice: Subject to any disclaimer, the term of this patent is extended or adjusted under 35 U.S.C. 154(b) by 374 days.

(21) Appl. No.: 17/581,604

(22) Filed: Jan. 21, 2022

(65) Prior Publication Data
US 2023/0237691 A1 Jul. 27, 2023

(51) Int. Cl.
*G06T 7/73* (2017.01)
*G06T 7/11* (2017.01)
*H01J 37/20* (2006.01)
*H01J 37/22* (2006.01)

(52) U.S. Cl.
CPC .......... *G06T 7/73* (2017.01); *G06T 7/11* (2017.01); *H01J 37/20* (2013.01); *H01J 37/222* (2013.01); *G06T 2207/10061* (2013.01); *G06T 2207/20081* (2013.01); *G06T 2207/30148* (2013.01)

(58) Field of Classification Search
CPC ... G06T 7/73; G06T 7/11; G06T 2207/10061; G06T 2207/20081; G06T 2207/30148; H01J 37/20; H01J 37/222; H01J 37/226; H01J 2237/20285; H01J 37/26; G06N 3/09; G06N 3/08; G06N 20/00; G01N 23/225; G01N 23/2204; G01N 2223/307; G01N 2223/309; G01N 2223/321; G01N 2223/33; G01N 2223/401; G01N 2223/418; G01N 2223/6116; G01N 2223/645; G01N 2223/6462

USPC .......................................................... 382/107
See application file for complete search history.

(56) References Cited

U.S. PATENT DOCUMENTS 8,829,470 B2 * 9/2014 Tůma ................. H01J 37/20 250/311
11,404,243 B1 * 8/2022 Own .................. H01J 37/244

OTHER PUBLICATIONS

S. Zimmermann, T. Tiemerding, O. C. Haenssler and S. Fatikow, "Automated robotic manipulation of individual sub-micro particles using a dual probe setup inside the scanning electron microscope," 2015 IEEE International Conference on Robotics and Automation (ICRA), Seattle, WA, USA, 2015, pp. 950-955, (Year: 2015).*

* cited by examiner

*Primary Examiner* — Neil R Mclean

(57) ABSTRACT

Disclosed herein are scientific instrument support systems, as well as related methods, computing devices, and computer-readable media. For example, in some embodiments, a method for determining sample location and associated stage coordinates by a microscope at least comprises acquiring, with a navigation camera, an image of a plurality of samples loaded on a fixture, the image being of low resolution at a field of view that includes the fixture and all samples of the plurality of samples, analyzing the image with a trained model to identify the plurality of samples, based on the analysis, associating each sample with a location on the fixture, based on the location on the fixture of each sample, associating separate stage coordinate information with each sample of the plurality of samples loaded on the fixture, and translating a stage holding the fixture to first stage coordinates based on the associated stage coordinate information of a first sample of the plurality of samples.

20 Claims, 5 Drawing Sheets

DEEP LEARNING BASED SAMPLE LOCALIZATION

FIELD OF THE INVENTION

The invention relates generally to charged particle microscope lenses, and specifically to charged particle microscope objective lenses that produce negligible or zero magnetic field at a sample plane, at least in the direction of the optical axis.

BACKGROUND

Microscopy is utilized in many industries for quality control, defect detection, process analysis, etc. so that companies can understand their processes and characterize them accordingly. For example, the semiconductor industry uses various microscopy tools, such as charged particle microscopes (e.g., scanning electron microscope (SEM), focused ion beam (FIB) microscopes, dual beams that combine both an SEM and a FIB, transmission electron microscope (TEM), and scanning TEM (STEM)), to conduct analysis of their processes and resulting devices. Such use of microscopes on samples taken from larger process lots, e.g., wafer lots, wafers, etc., has historically been a highly manual task to identify, track and transport such samples. However, with current advances in robotics and control algorithms, automated sample identification, tracking and handling is desired, which would allow skilled technicians to perform more value-added tasks than loading samples and tracking those samples through the various microscopy processes.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

DETAILED DESCRIPTION

Figure 1A:
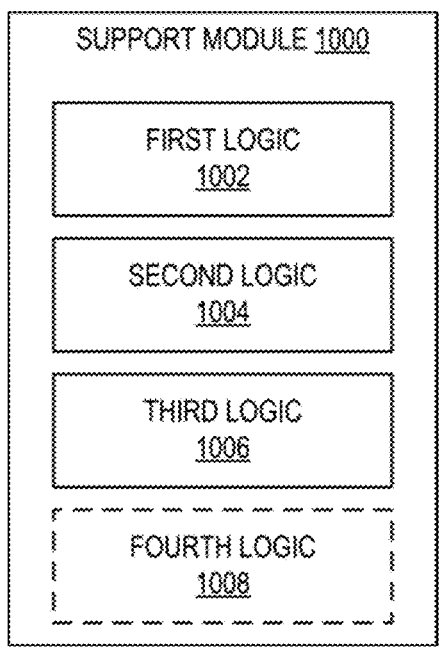
FIG. 1A is an illustrative block diagram of charged particle microscope (CPM) support module 1000 for performing sample related operations, in accordance with various embodiments disclosed herein.

Disclosed herein are scientific instrument support systems, as well as related methods, computing devices, and computer-readable media. For example, in some embodiments, a method for determining sample location and associated stage coordinates by a microscope at least comprises acquiring, with a navigation camera, an image of a plurality of samples loaded on a fixture, the image being of low resolution at a field of view that includes the fixture and all samples of the plurality of samples, analyzing the image with a trained model to identify the plurality of samples, based on the analysis, associating each sample with a location on the fixture, based on the location on the fixture of each sample, associating separate stage coordinate information with each sample of the plurality of samples loaded on the fixture, and translating a stage holding the fixture to first stage coordinates based on the associated stage coordinate information of a first sample of the plurality of samples.

In another embodiment, the disclosed techniques at least include generating a work file for a plurality of samples, the work file at least includes a sample ID and a process associated with each sample of the plurality of samples, loading the plurality of samples onto a fixture, the fixture including a plurality of fixture locations, wherein each fixture location can accept one sample, and wherein each fixture location is at known location on the fixture and have associated identifiers, and wherein the fixture includes markers that orient the fixture locations, updating the work file to associate each sample of the plurality of samples with a fixture location, loading the fixture into a charged particle microscope (CPM), the fixture mounted on a stage of the CPM and the stage moves so that the fixture is in a location that is coincident with a charged particle beam and a navigation camera (navcam), acquiring an image of the fixture with the navcam, providing the image to a trained model for analysis, receiving, from the trained model, stage coordinate information for each sample loaded on the fixture, updating the job file to associate the stage coordinate information for each sample, and initiating the work file to process each sample.

The scientific instrument support embodiments disclosed herein may achieve improved performance relative to conventional approaches. For example, the extreme manual requirement of previous sample tracking and identification in a microscope before initiating a designated process has been removed by the disclosed techniques. For example, the disclosed technique includes using a trained model to identify samples in an image taken in the microscope, identify each sample based on a location the sample is on a fixture, and associate stage coordinates with each identified sample based on their fixture location. The stage coordinates are then used by the microscope to move a stage to process each sample. Such automation allows the skilled technicians to perform more valuable tasks associated with data and/or control a fleet of microscopes instead of one or two. The embodiments disclosed herein thus provide improvements to scientific instrument technology (e.g., improvements in the computer technology supporting such scientific instruments, among other improvements).

Various ones of the embodiments disclosed herein may improve upon conventional approaches to achieve the technical advantages of higher throughput, more accurate data to sample association, and increased efficiency by automating the steps of identifying a sample loaded on a fixture, associating that sample with specific stage coordinates that are stored in a related job file that will be used to automatically process each sample on the fixture. Once the sample processing begins, the system can navigate to each sample location automatically due to the stored stage coordinates without needing a user to perform the navigation. Such technical advantages are not achievable by routine and conventional approaches, and all users of systems including such embodiments may benefit from these advantages (e.g., by assisting the user in the performance of a technical task, such as automated sample identification and stage coordinate association, by means of a guided human-machine interaction process). The technical features of the embodiments disclosed herein are thus decidedly unconventional in the field of microscopy, especially charged particle microscopy, as are the combinations of the features of the embodiments disclosed herein. As discussed further herein, various aspects of the embodiments disclosed herein may improve the functionality of a computer itself; for example, by providing one or more trained models that allows the computer to perform the disclosed techniques, which are not capable by conventional algorithms. The computational and user interface features disclosed herein do not only involve the collection and comparison of information, but apply new analytical and technical techniques to change the operation of charged particle microscopes. The present disclosure thus introduces functionality that neither a conventional computing device, nor a human, could perform.

Accordingly, the embodiments of the present disclosure may serve any of a number of technical purposes, such as controlling a specific technical system or process; determining from measurements how to control a machine; and/or digital audio, image, or video enhancement or analysis. In particular, the present disclosure provides technical solutions to technical problems, including but not limited to automated sample identification and associating a stage location with each identified sample.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the subject matter disclosed herein. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrases "A and/or B" and "A or B" mean (A), (B), or (A and B). For the purposes of the present disclosure, the phrases "A, B, and/or C" and "A, B, or C" mean (A), (B), (C), (A and B), (A and C), (B and C), or (A, B, and C). Although some elements may be referred to in the singular (e.g., "a processing device"), any appropriate elements may be represented by multiple instances of that element, and vice versa. For example, a set of operations described as performed by a processing device may be implemented with different ones of the operations performed by different processing devices.

The description uses the phrases "an embodiment," "various embodiments," and "some embodiments," each of which may refer to one or more of the same or different embodiments. Furthermore, the terms "comprising," "including," "having," and the like, as used with respect to embodiments of the present disclosure, are synonymous. When used to describe a range of dimensions, the phrase "between X and Y" represents a range that includes X and Y. As used herein, an "apparatus" may refer to any individual device, collection of devices, part of a device, or collections of parts of devices. The drawings are not necessarily to scale.

Figure 1B:
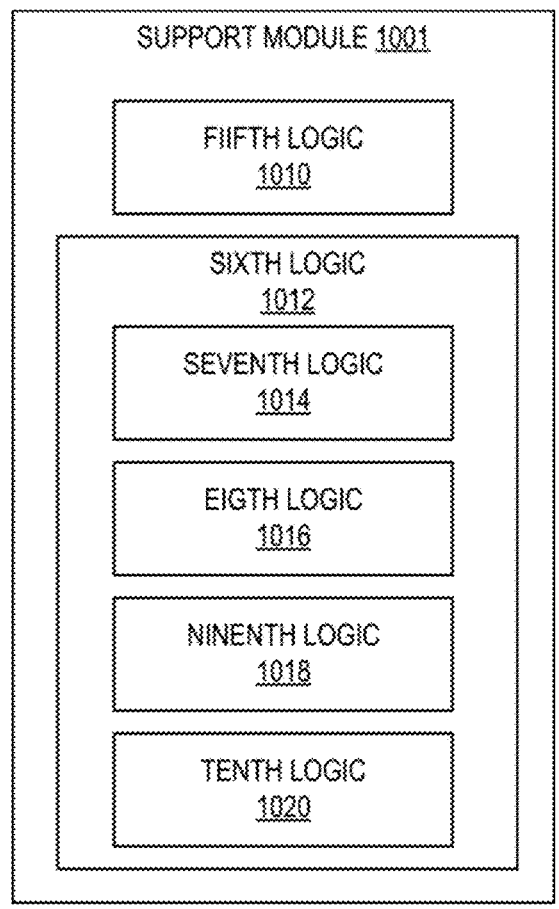
FIG. 1B is an illustrative block diagram of charged particle microscope (CPM) support module for performing sample related operations, in accordance with various embodiments disclosed herein.

FIGS. 1A and 1B are illustrative block diagrams of charged particle microscope (CPM) support modules 1000 and 1001 for performing sample related operations, in accordance with various embodiments disclosed herein. The CPM support modules 1000, 1001 may be implemented by circuitry (e.g., including electrical and/or optical components), such as a programmed computing device. The logic of the CPM support module 1000 may be included in a single computing device or may be distributed across multiple computing devices that are in communication with each other as appropriate. Examples of computing devices that may, singly or in combination, implement the CPM support modules 1000, 1001 are discussed herein with reference to the computing device 4000 of FIG. 4, and examples of systems of interconnected computing devices, in which the CPM support modules 1000, 1001 may be implemented across one or more of the computing devices, is discussed herein with reference to the CPM support system 5000 of FIG. 5.

The CPM support module 1000 may include first logic 1002, second logic 1004, third logic 1006, and (optional) fourth logic 1008. CPM support module 1001 may include fifth logic 1010, sixth logic 1012, and seventh logic 1014. As used herein, the term "logic" may include an apparatus that is to perform a set of operations associated with the logic. For example, any of the logic elements included in the support modules 1000, 1001 may be implemented by one or more computing devices programmed with instructions to cause one or more processing devices of the computing devices to perform the associated set of operations. In a particular embodiment, a logic element may include one or more non-transitory computer-readable media having instructions thereon that, when executed by one or more processing devices of one or more computing devices, cause the one or more computing devices to perform the associated set of operations. As used herein, the term "module" may refer to a collection of one or more logic elements that, together, perform a function associated with the module. Different ones of the logic elements in a module may take the same form or may take different forms. For example, some logic in a module may be implemented by a programmed general-purpose processing device, while other logic in a module may be implemented by an application-specific integrated circuit (ASIC). In another example, different ones of the logic elements in a module may be associated with different sets of instructions executed by one or more processing devices. A module may not include all of the logic elements depicted in the associated drawing; for example, a module may include a subset of the logic elements depicted in the associated drawing when that module is to perform a subset of the operations discussed herein with reference to that module.

The first logic 1002 may include data handling logic that can receive one or more job files. A job file may include a sample identification number (sample ID) and an associated process to be performed by the CPM on that sample. Additionally, the job file may include information associating the sample with a location the sample is loaded on a fixture, as will be discussed in more detail below, which may be referred to as a sample location or a fixture location. In general, first logic 1002 may handle data received from external and internal sources and store that data with a correct sample, where the data file includes information about each sample loaded on a specific fixture.

The second logic 1004 may include the CPM control routines for implementing various tasks the CPM performs. For example, the second logic 1004 may include control routines for loading the fixture into the CPM and moving the fixture into position under an SEM column where it is also visible by at least one other camera, such as a navigational camera. Second control logic 1004 may then cause an image to be acquired of the fixture using the navigational camera and/or the SEM. The navigational camera may be referred to as the navcam image herein. In addition to movement of a stage, the second logic 1004 may also include control routines for performing imaging using various parameters using either the navcam or the SEM. Example imaging parameters for an SEM may at least include electron beam energy, electron beam dwell time, electron beam raster rate, image magnification, resolution, and field of view, to give a few examples. Regardless of the image processes, the control logic 1004 may access the job file to move the stage to specific stage coordinates associated with each sample, once determined, so that the imaging processes associated with each sample may be performed. One skilled in the art will know and understand the various control features of a CPM and will further recognize the above discussion is not an exhaustive list of the various control aspects.

The third logic 1006 may be responsible for providing and receiving information, data and/or images to/from users and/or processing logic located outside of the CPM. For example, third logic 1006 may cause at least the navcam image to be provided to processing logic coupled to the CPM via a network, such as a local area network, wide area network or the world wide web. Alternatively or additionally, third logic 1006 may provide the data, information and/or images to fourth logic 1008. Furthermore, third logic 1006 may also update the job file with the processes data, e.g., images, of each sample as the process is being performed, or after performance. In general, third logic 1006 is input/output logic to control the flow of information within support module 1000 as well as into and out of support module 1000.

The fourth logic 1008, which may be optional, may include one or more deep learning-based models trained to identify the samples and their locations in the navcam image and associated stage locations with each sample. The stage locations inform the CPM where to move the stage to align each sample with the SEM column of the CPM. As will be discussed in more detail below, the fixture may include markers formed thereon that allow the fourth logic 1008 to determine the orientation of the fixture so that the individual sample locations, which are pre-identified, to be located, and which allows the fourth logic 1008 to associate a stage location with each sample. It should be noted that the fixture may have a set number of sample locations where each location has been pre-associated with a sample ID so that the job file associates each sample ID with a sample location on the fixture. As such, fourth logic 1008 determines where each sample location is with respect to the fixture markers and provides the associated stage location for each sample to first logic 1004 to add to the job file.

The fifth logic 1010 of FIG. 1B may be input/output control logic configured to receive data and provide data as needed. For example, fifth logic 101 may receive the navcam image from third logic 1006.

Sixth logic 1012 may include one or more logic features that work in concert to analyze a navcam image and provide stage coordinates for each identified sample. The various processing logic of sixth logic 1012 may be broken down into separate logic components 1014, 1016, 1018 and 1020, for example. However, it should be understood that this division is merely for illustration and more, different or fewer divisions may be made. Sixth logic 1012 may include a ML or AI trained model for segmenting the received images, e.g., the navcam, image so that sample locations and samples can be identified in the image. In some embodiments, sixth logic 1012 may be broken into multiple logic modules, as noted, with each module performing a separate function with the ultimate goal being to provide stage coordinates for each sample identified in the navcam image. For example, seventh logic 1014 may only segment images and provide the segmented image to a separate logic for additional analysis, such as to eighth logic 1016 that identifies samples in the image. After the samples are identified, then ninth logic 1018 may determine each identified sample's location on the fixture. And lastly, tenth logic 1020 may determine a stage location for each sample based on that sample's location on the fixture.

In general, the AI and ML models may be trained to identify samples via image segmentation, for example, determine the location of each sample with regards to the pre-known sample locations on the fixture, then associate a stage coordinate with each sample based on each sample's location. Such stage coordinate information may then be provided to the job file.

In some examples, support modules 1000 and 1001 may both be included in a CPM and provide the disclosed logic functions in response to input controls. In other embodiments, however, support module 1000 may be included in the CPM while support module 1001 may be located separately, such as at a remote server accessed through any type of network. In yet other embodiments, both support modules 1000 and 1001 may be located remotely from the CPM and accessed through a network.

Figure 2:
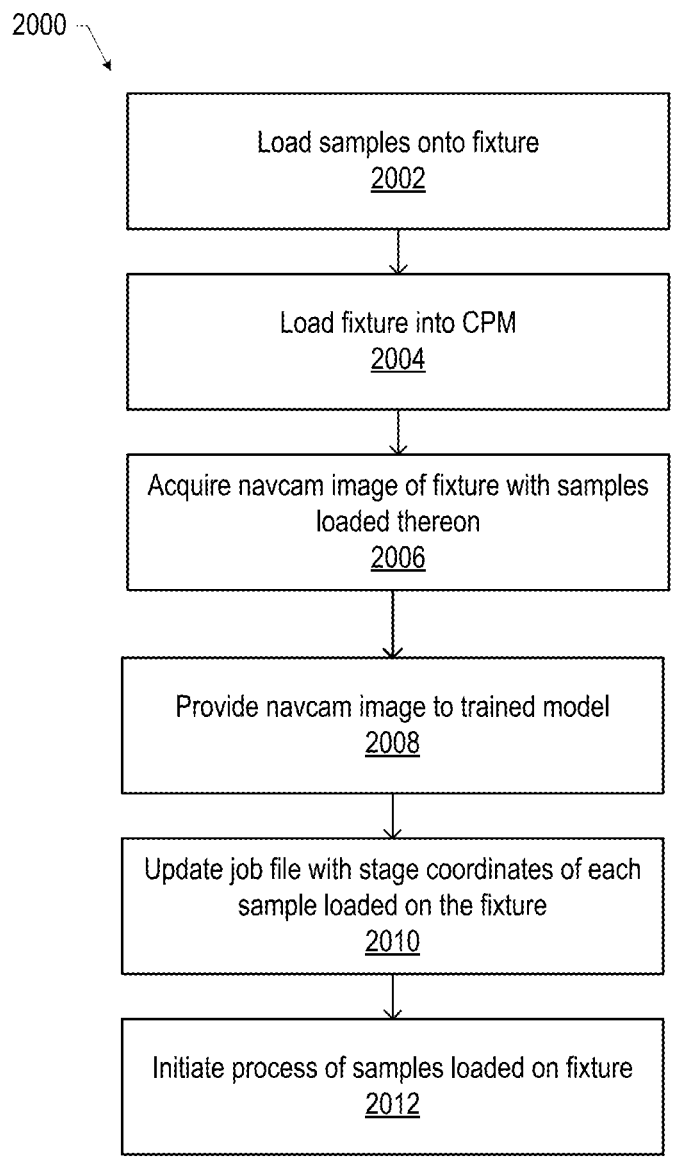
FIG. 2 is a flow diagram of a method for performing support operations, in accordance with various embodiments.

FIG. 2 is a flow diagram of a method 2000 for performing support operations, in accordance with various embodiments. Although the operations of the method 2000 may be illustrated with reference to particular embodiments disclosed herein (e.g., the CPM support modules 1000, 1001 discussed herein with reference to FIGS. 1A and 1B, the computing devices 4000 discussed herein with reference to FIG. 4, and/or the scientific instrument support system 5000 discussed herein with reference to FIG. 5), the method 2000 may be used in any suitable setting to perform any suitable support operations. Operations are illustrated once each and in a particular order in FIG. 2, but the operations may be reordered and/or repeated as desired and appropriate (e.g., different operations performed may be performed in parallel, as suitable).

At 2002, first operations may be performed. In some examples, the first operation 2002 may be performed manually by a user, but in other examples, the first operation 2002 may be performed automatically by a robotic instrument, for example. The first operations may include loading samples onto a fixture. For example, a plurality of samples may be loaded into fixture locations, such as shown as locations 1 through 9 in FIG. 6.

At 2004, second operations may be performed. As with the first operations 2002, the second operation 2004 may be performed manually by a user, but in other examples, the second operation 2004 may be performed automatically by a robotic instrument, for example. The second operations may include loading the fixture into the CPM. The fixture, which will have the plurality of samples loaded thereon, will be loaded through a load lock, for example, and placed on or engaged with a moveable stage of the CPM. The loading of the fixture will further include movement of the stage to place the fixture in an imaging position of both a charged particle beam of the CPM and a low resolution, large field of view camera. The low resolution, large field of view camera may be the navcam as discussed above and will be arranged within the CPM to image the fixture when the fixture is coincident with a charged particle beam.

At 2006, third operations may be performed. For example, the second logic 1004 of a support module woo may perform the operations of 2006. The third operations 2006 may include acquisition of an image of the fixture including the samples using the navcam. Such image may be only of greyscale values and will provide a large field of view image of the entire fixture including all samples loaded thereon. Such image may be referred to herein as the navcam image.

At 2008, fourth operations may be performed. For example, the third logic 1006 of a support module woo may perform the operations of 2008. The fourth operations 2008 may include providing the navcam image to a trained model for analysis. The trained model may be a deep learning model, machine learning model, neural network model, or the like, trained to identify samples loaded on the fixture, associate a sample location with each sample, and provide stage coordinates based thereon. The stage coordinates will be used by the CPM to align the associated sample with the charged particle beam for imaging and/or processing. As will be discussed below, the fixture may include markers that allow the trained model to orient the fixture with the sample locations and their labels. For example, each fixture location may be numbered, for example, so that the trained model can associate each sample with a fixture location.

At 2010, fifth support operations may be performed. For example, first logic 1002 may update the job file with stage coordinates of each sample loaded on the fixture based on the analysis performed by a trained model.

At 2012, sixth support operations may be performed. For example, second logic 1004 may perform the processes associated with each sample as indicated in the job file, and which may include translating the stage to stage coordinates for each sample prior to performing the associated process with that sample.

Figure 4:
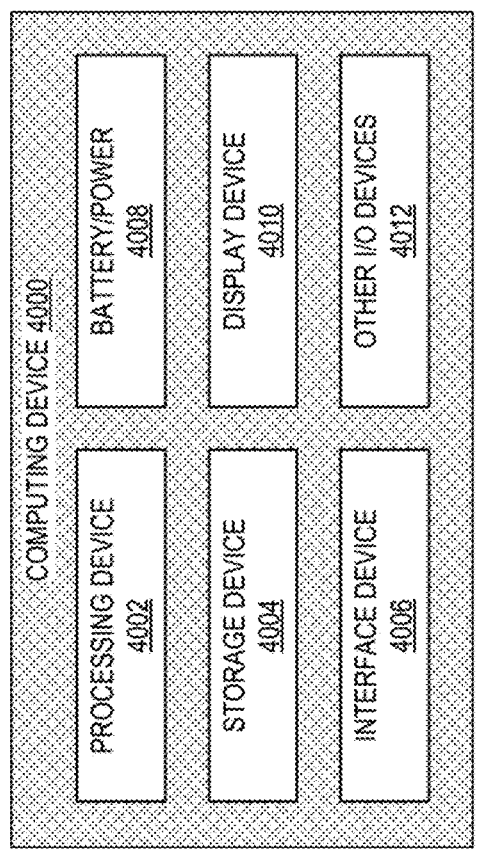
FIG. 4 is a block diagram of a computing device that may perform some or all of the scientific instrument support methods disclosed herein, in accordance with various embodiments.
Figure 5:
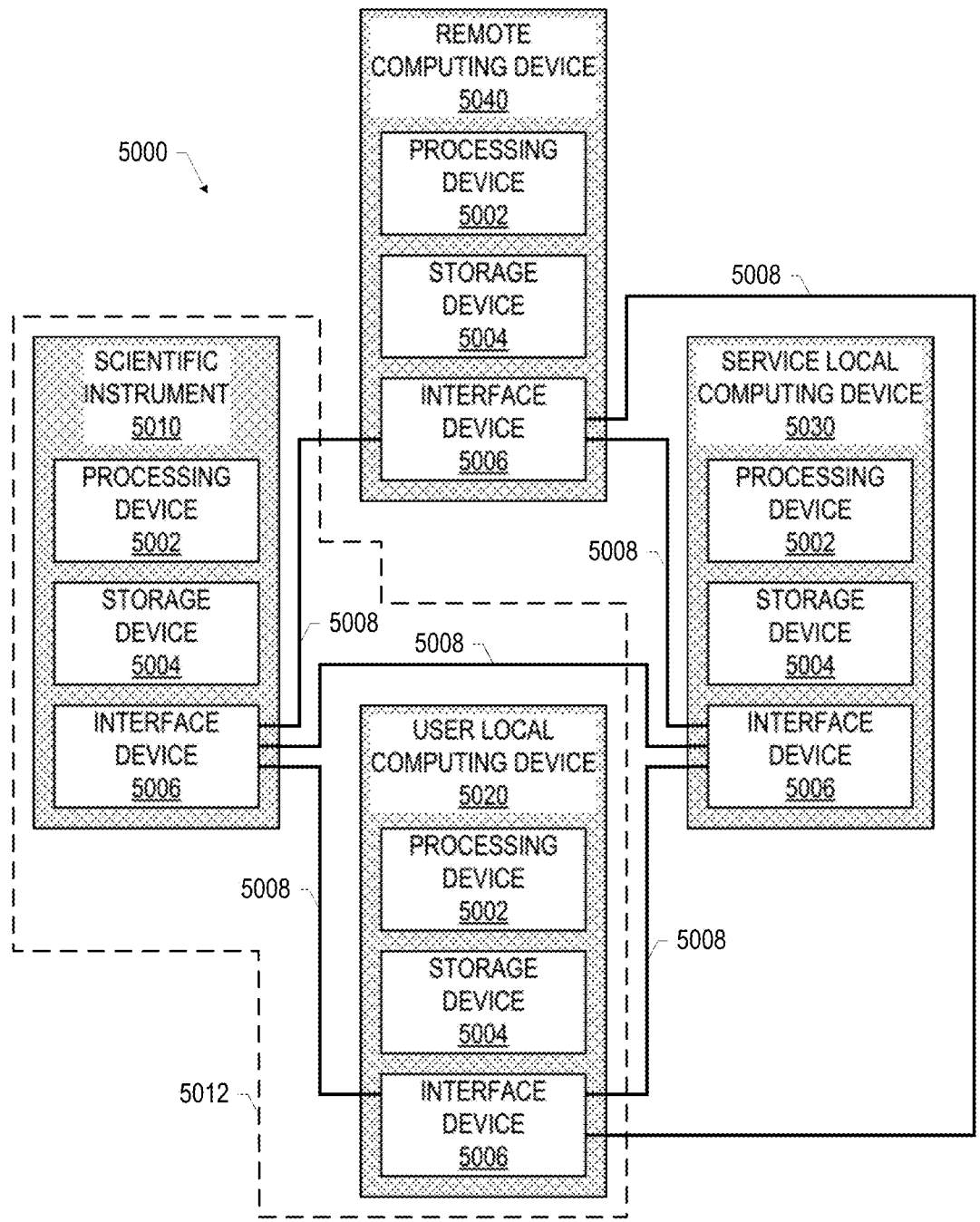
FIG. 5 is a block diagram of an example scientific instrument support system in which some or all of the scientific instrument support methods disclosed herein may be performed, in accordance with various embodiments.

The scientific instrument support methods disclosed herein may include interactions with a human user (e.g., via the user local computing device 5020 discussed herein with reference to FIG. 5). These interactions may include providing information to the user (e.g., information regarding the operation of a scientific instrument such as the scientific instrument 5010 of FIG. 5, information regarding a sample being analyzed or other test or measurement performed by a scientific instrument, information retrieved from a local or remote database, or other information) or providing an option for a user to input commands (e.g., to control the operation of a scientific instrument such as the scientific instrument 5010 of FIG. 5, or to control the analysis of data generated by a scientific instrument), queries (e.g., to a local or remote database), or other information. In some embodiments, these interactions may be performed through a graphical user interface (GUI) that includes a visual display on a display device (e.g., the display device 4010 discussed herein with reference to FIG. 4) that provides outputs to the user and/or prompts the user to provide inputs (e.g., via one or more input devices, such as a keyboard, mouse, trackpad, or touchscreen, included in the other I/O devices 4012 discussed herein with reference to FIG. 4). The scientific instrument support systems disclosed herein may include any suitable GUIs for interaction with a user.

Figure 3:
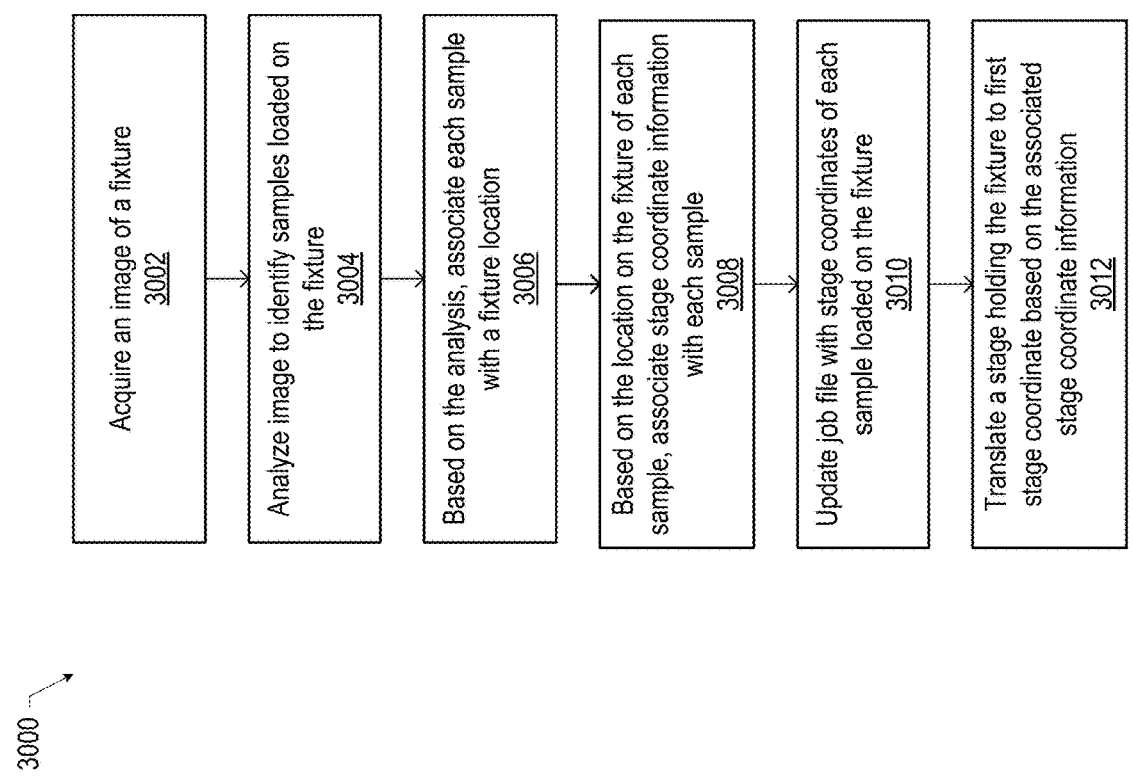
FIG. 3 is a flow diagram of a method of performing support operations, in accordance with various embodiments.

FIG. 3 is a flow diagram of a method 3000 of performing support operations, in accordance with various embodiments. Although the operations of the method 3000 may be illustrated with reference to particular embodiments disclosed herein (e.g., the CPM support modules 1000, 1001 discussed herein with reference to FIGS. 1A and 1B, the computing devices 4000 discussed herein with reference to FIG. 4, and/or the scientific instrument support system 5000 discussed herein with reference to FIG. 5), the method 3000 may be used in any suitable setting to perform any suitable support operations. Operations are illustrated once each and in a particular order in FIG. 3, but the operations may be reordered and/or repeated as desired and appropriate (e.g., different operations performed may be performed in parallel, as suitable).

At 3002, first operations may be performed. In some examples, the first operation 3002 may include acquiring an image of a fixture, where the image is acquired with a navigational camera, as discussed above. The fixture may have one or more samples loaded thereon in designated locations and may have been loaded onto a stage of a CPM. For example, a plurality of samples may be loaded into fixture locations, such as shown as locations 1 through 9 in FIG. 6.

At 3004, second operations may be performed. The second operations may include analyzing the image to identify the samples loaded onto the fixture, which may be performed by either fourth logic 1008 or sixth and/or seventh logic 1012, 1014. The analysis may be performed by a ML or AI based trained model that has been trained to at least segment the image and identify the samples loaded on the fixture. In some embodiments, the model is trained to associate each identified sample with a known location on the fixture, which may be determined based on marks on the fixture. The marks may provide orientation information for the model. Additionally, based on fixture locations designated for accepting a sample, which is part of the training. The fixture, which will have the plurality of samples loaded thereon, will be loaded through a load lock, for example, and placed on or engaged with a moveable stage of the CPM. The loading of the fixture will further include movement of the stage to place the fixture in an imaging position of both a charged particle beam of the CPM and a low resolution, large field of view camera. The low resolution, large field of view camera may be the navcam as discussed above and will be arranged within the CPM to image the fixture when the fixture is coincident with a charged particle beam.

At 3006, third operations may be performed. For example, the fourth logic 1004, sixth logic 1012, and/or ninth logic 1018 of support modules 1000, 1001 may perform the operations of 3006. The third operations 3006 may include associating each sample with a fixture location based on a trained model of the functional logic analyzing the navcam image and determining where each sample is with respect to pre-known fixture locations.

At 3008, fourth operations may be performed. The fourth operations 3008 may include associating stage coordinate information with each sample based on the location on the fixture of each sample. The trained model of either the fourth, sixth or tenth logic 1008, 1012, 1020, respectively may perform the analysis. The stage coordinates will be used by the CPM to align the associated sample with the charged particle beam for imaging and/or processing. As will be discussed below, the fixture may include markers that allow the trained model to orient the fixture with the sample locations and their labels. For example, each fixture location may be numbered, for example, so that the trained model can associate each sample with a fixture location.

At 3010, fifth support operations may be performed. For example, fifth logic 1010 may provide stage coordinate information to second logic 1004, which will update the job file with stage coordinates of each sample loaded on the fixture based on the analysis performed by a trained model.

At 3012, sixth support operations may be performed. For example, first logic 1002 may perform the processes associated with each sample as indicated in the job file, and which may include translating the stage to stage coordinates for each sample prior to performing the associated process with that sample.

The scientific instrument support methods disclosed herein may include interactions with a human user (e.g., via the user local computing device 5020 discussed herein with reference to FIG. 5). These interactions may include providing information to the user (e.g., information regarding the operation of a scientific instrument such as the scientific instrument 5010 of FIG. 5, information regarding a sample being analyzed or other test or measurement performed by a scientific instrument, information retrieved from a local or remote database, or other information) or providing an option for a user to input commands (e.g., to control the operation of a scientific instrument such as the scientific instrument 5010 of FIG. 5, or to control the analysis of data generated by a scientific instrument), queries (e.g., to a local or remote database), or other information. In some embodiments, these interactions may be performed through a graphical user interface (GUI) that includes a visual display on a display device (e.g., the display device 4010 discussed herein with reference to FIG. 4) that provides outputs to the user and/or prompts the user to provide inputs (e.g., via one or more input devices, such as a keyboard, mouse, trackpad, or touchscreen, included in the other I/O devices 4012 discussed herein with reference to FIG. 4). The scientific instrument support systems disclosed herein may include any suitable GUIs for interaction with a user.

As noted above, the scientific instrument support modules 1000, 1001 may be implemented by one or more computing devices. FIG. 4 is a block diagram of a computing device 4000 that may perform some or all of the scientific instrument support methods disclosed herein, in accordance with various embodiments. In some embodiments, the scientific instrument support modules 1000, 1001 may be implemented by a single computing device 4000 or by multiple computing devices 4000. Further, as discussed below, a computing device 4000 (or multiple computing devices 4000) that implements the scientific instrument support module 1000 may be part of one or more of the scientific instrument 5010, the user local computing device 5020, the service local computing device 5030, or the remote computing device 5040 of FIG. 5.

The computing device 4000 of FIG. 4 is illustrated as having a number of components, but any one or more of these components may be omitted or duplicated, as suitable for the application and setting. In some embodiments, some or all of the components included in the computing device 4000 may be attached to one or more motherboards and enclosed in a housing (e.g., including plastic, metal, and/or other materials). In some embodiments, some these components may be fabricated onto a single system-on-a-chip (SoC) (e.g., an SoC may include one or more processing devices 4002 and one or more storage devices 4004). Additionally, in various embodiments, the computing device 4000 may not include one or more of the components illustrated in FIG. D, but may include interface circuitry (not shown) for coupling to the one or more components using any suitable interface (e.g., a Universal Serial Bus (USB) interface, a High-Definition Multimedia Interface (HDMI) interface, a Controller Area Network (CAN) interface, a Serial Peripheral Interface (SPI) interface, an Ethernet interface, a wireless interface, or any other appropriate interface). For example, the computing device 4000 may not include a display device 4010, but may include display device interface circuitry (e.g., a connector and driver circuitry) to which a display device 4010 may be coupled.

The computing device 4000 may include a processing device 4002 (e.g., one or more processing devices). As used herein, the term "processing device" may refer to any device or portion of a device that processes electronic data from registers and/or memory to transform that electronic data into other electronic data that may be stored in registers and/or memory. The processing device 4002 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices.

The computing device 4000 may include a storage device 4004 (e.g., one or more storage devices). The storage device 4004 may include one or more memory devices such as random access memory (RAM) (e.g., static RAM (SRAM) devices, magnetic RAM (MRAM) devices, dynamic RAM (DRAM) devices, resistive RAM (RRAM) devices, or conductive-bridging RAM (CBRAM) devices), hard drive-based memory devices, solid-state memory devices, networked drives, cloud drives, or any combination of memory devices. In some embodiments, the storage device 4004 may include memory that shares a die with a processing device 4002. In such an embodiment, the memory may be used as cache memory and may include embedded dynamic random access memory (eDRAM) or spin transfer torque magnetic random access memory (STT-MRAM), for example. In some embodiments, the storage device 4004 may include non-transitory computer readable media having instructions thereon that, when executed by one or more processing devices (e.g., the processing device 4002), cause the computing device 4000 to perform any appropriate ones of or portions of the methods disclosed herein.

The computing device 4000 may include an interface device 4006 (e.g., one or more interface devices 4006). The interface device 4006 may include one or more communication chips, connectors, and/or other hardware and software to govern communications between the computing device 4000 and other computing devices. For example, the interface device 4006 may include circuitry for managing wireless communications for the transfer of data to and from the computing device 4000. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not. Circuitry included in the interface device 4006 for managing wireless communications may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). In some embodiments, circuitry included in the interface device 4006 for managing wireless communications may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. In some embodiments, circuitry included in the interface device 4006 for managing wireless communications may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). In some embodiments, circuitry included in the interface device 4006 for managing wireless communications may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. In some embodiments, the interface device 4006 may include one or more antennas (e.g., one or more antenna arrays) to receipt and/or transmission of wireless communications.

In some embodiments, the interface device 4006 may include circuitry for managing wired communications, such as electrical, optical, or any other suitable communication protocols. For example, the interface device 4006 may include circuitry to support communications in accordance with Ethernet technologies. In some embodiments, the interface device 4006 may support both wireless and wired communication, and/or may support multiple wired communication protocols and/or multiple wireless communication protocols. For example, a first set of circuitry of the interface device 4006 may be dedicated to shorter-range wireless communications such as Wi-Fi or Bluetooth, and a second set of circuitry of the interface device 4006 may be dedicated to longer-range wireless communications such as global positioning system (GPS), EDGE, GPRS, CDMA, WiMAX, LTE, EV-DO, or others. In some embodiments, a first set of circuitry of the interface device 4006 may be dedicated to wireless communications, and a second set of circuitry of the interface device 4006 may be dedicated to wired communications.

The computing device 4000 may include battery/power circuitry 4008. The battery/power circuitry 4008 may include one or more energy storage devices (e.g., batteries or capacitors) and/or circuitry for coupling components of the computing device 4000 to an energy source separate from the computing device 4000 (e.g., AC line power).

The computing device 4000 may include a display device 4010 (e.g., multiple display devices). The display device 4010 may include any visual indicators, such as a heads-up display, a computer monitor, a projector, a touchscreen display, a liquid crystal display (LCD), a light-emitting diode display, or a flat panel display.

The computing device 4000 may include other input/output (I/O) devices 4012. The other I/O devices 4012 may include one or more audio output devices (e.g., speakers, headsets, earbuds, alarms, etc.), one or more audio input devices (e.g., microphones or microphone arrays), location devices (e.g., GPS devices in communication with a satellite-based system to receive a location of the computing device 4000, as known in the art), audio codecs, video codecs, printers, sensors (e.g., thermocouples or other temperature sensors, humidity sensors, pressure sensors, vibration sensors, accelerometers, gyroscopes, etc.), image capture devices such as cameras, keyboards, cursor control devices such as a mouse, a stylus, a trackball, or a touchpad, bar code readers, Quick Response (QR) code readers, or radio frequency identification (RFID) readers, for example.

The computing device 4000 may have any suitable form factor for its application and setting, such as a handheld or mobile computing device (e.g., a cell phone, a smart phone, a mobile internet device, a tablet computer, a laptop computer, a netbook computer, an ultrabook computer, a personal digital assistant (PDA), an ultra mobile personal computer, etc.), a desktop computing device, or a server computing device or other networked computing component.

One or more computing devices implementing any of the scientific instrument support modules or methods disclosed herein may be part of a scientific instrument support system. FIG. 5 is a block diagram of an example scientific instrument support system 5000 in which some or all of the scientific instrument support methods disclosed herein may be performed, in accordance with various embodiments. The scientific instrument support modules and methods disclosed herein (e.g., the scientific instrument support modules 1000, 1001 of FIGS. 1A and 1B, the method 2000 of FIG. 2, and the method 3000 of FIG. 3) may be implemented by one or more of the scientific instrument 5010, the user local computing device 5020, the service local computing device 5030, or the remote computing device 5040 of the scientific instrument support system 5000.

Any of the scientific instrument 5010, the user local computing device 5020, the service local computing device 5030, or the remote computing device 5040 may include any of the embodiments of the computing device 4000 discussed herein with reference to FIG. 4, and any of the scientific instrument 5010, the user local computing device 5020, the service local computing device 5030, or the remote computing device 5040 may take the form of any appropriate ones of the embodiments of the computing device 4000 discussed herein with reference to FIG. 4.

The scientific instrument 5010, the user local computing device 5020, the service local computing device 5030, or the remote computing device 5040 may each include a processing device 5002, a storage device 5004, and an interface device 5006. The processing device 5002 may take any suitable form, including the form of any of the processing devices 4002 discussed herein with reference to FIG. 4, and the processing devices 5002 included in different ones of the scientific instrument 5010, the user local computing device 5020, the service local computing device 5030, or the remote computing device 5040 may take the same form or different forms. The storage device 5004 may take any suitable form, including the form of any of the storage devices 5004 discussed herein with reference to FIG. 4, and the storage devices 5004 included in different ones of the scientific instrument 5010, the user local computing device 5020, the service local computing device 5030, or the remote computing device 5040 may take the same form or different forms. The interface device 5006 may take any suitable form, including the form of any of the interface devices 4006 discussed herein with reference to FIG. 4, and the interface devices 5006 included in different ones of the scientific instrument 5010, the user local computing device 5020, the service local computing device 5030, or the remote computing device 5040 may take the same form or different forms.

The scientific instrument 5010, the user local computing device 5020, the service local computing device 5030, and the remote computing device 5040 may be in communication with other elements of the scientific instrument support system 5000 via communication pathways 5008. The communication pathways 5008 may communicatively couple the interface devices 5006 of different ones of the elements of the scientific instrument support system 5000, as shown, and may be wired or wireless communication pathways (e.g., in accordance with any of the communication techniques discussed herein with reference to the interface devices 4006 of the computing device 4000 of FIG. 4). The particular scientific instrument support system 5000 depicted in FIG. E includes communication pathways between each pair of the scientific instrument 5010, the user local computing device 5020, the service local computing device 5030, and the remote computing device 5040, but this "fully connected" implementation is simply illustrative, and in various embodiments, various ones of the communication pathways 5008 may be absent. For example, in some embodiments, a service local computing device 5030 may not have a direct communication pathway 5008 between its interface device 5006 and the interface device 5006 of the scientific instrument 5010, but may instead communicate with the scientific instrument 5010 via the communication pathway 5008 between the service local computing device 5030 and the user local computing device 5020 and the communication pathway 5008 between the user local computing device 5020 and the scientific instrument 5010.

Figure 7:
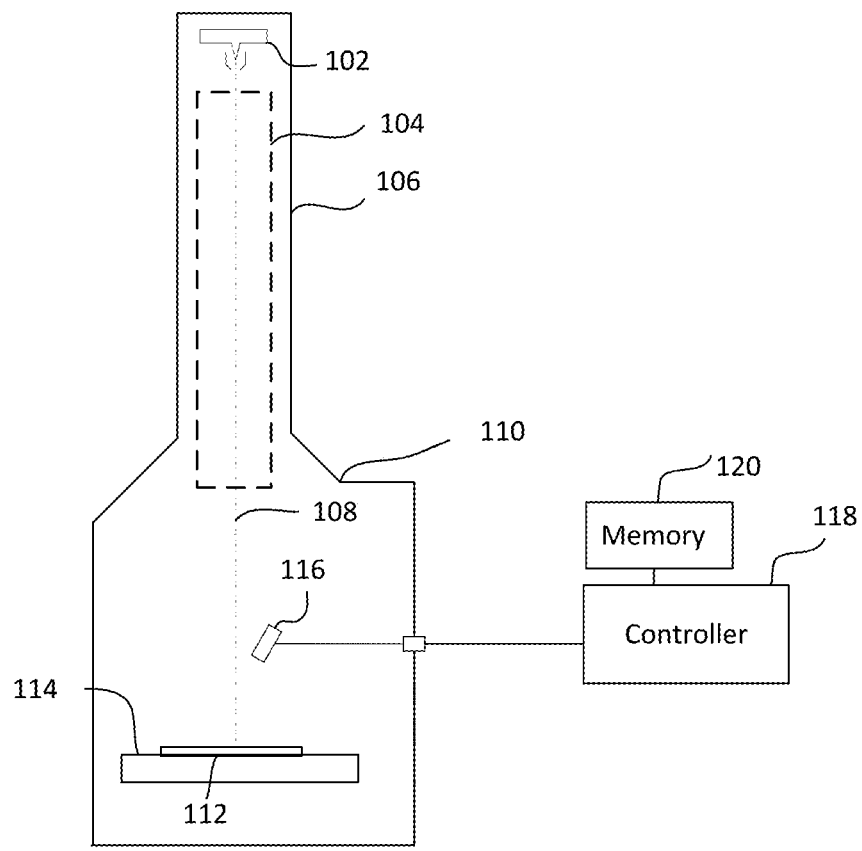
FIG. 7 is an example CPM in accordance with an embodiment of the present disclosure.

The scientific instrument 5010 may include any appropriate scientific instrument, such as a CPM discussed in FIG. 7.

The user local computing device 5020 may be a computing device (e.g., in accordance with any of the embodiments of the computing device 4000 discussed herein) that is local to a user of the scientific instrument 5010. In some embodiments, the user local computing device 5020 may also be local to the scientific instrument 5010, but this need not be the case; for example, a user local computing device 5020 that is in a user's home or office may be remote from, but in communication with, the scientific instrument 5010 so that the user may use the user local computing device 5020 to control and/or access data from the scientific instrument 5010. In some embodiments, the user local computing device 5020 may be a laptop, smartphone, or tablet device. In some embodiments the user local computing device 5020 may be a portable computing device. In some embodiments, the user local computing device 5020 may control initiation of the techniques disclosed herein and allow the user to control various tasks of the CPM as well.

The service local computing device 5030 may be a computing device (e.g., in accordance with any of the embodiments of the computing device 4000 discussed herein) that is local to an entity that services the scientific instrument 5010. For example, the service local computing device 5030 may be local to a manufacturer of the scientific instrument 5010 or to a third-party service company. In some embodiments, the service local computing device 5030 may communicate with the scientific instrument 5010, the user local computing device 5020, and/or the remote computing device 5040 (e.g., via a direct communication pathway 5008 or via multiple "indirect" communication pathways 5008, as discussed above) to receive data regarding the operation of the scientific instrument 5010, the user local computing device 5020, and/or the remote computing device 5040 (e.g., the results of self-tests of the scientific instrument 5010, calibration coefficients used by the scientific instrument 5010, the measurements of sensors associated with the scientific instrument 5010, etc.). In some embodiments, the service local computing device 5030 may communicate with the scientific instrument 5010, the user local computing device 5020, and/or the remote computing device 5040 (e.g., via a direct communication pathway 5008 or via multiple "indirect" communication pathways 5008, as discussed above) to transmit data to the scientific instrument 5010, the user local computing device 5020, and/or the remote computing device 5040 (e.g., to update programmed instructions, such as firmware, in the scientific instrument 5010, to initiate the performance of test or calibration sequences in the scientific instrument 5010, to update programmed instructions, such as software, in the user local computing device 5020 or the remote computing device 5040, etc.). A user of the scientific instrument 5010 may utilize the scientific instrument 5010 or the user local computing device 5020 to communicate with the service local computing device 5030 to report a problem with the scientific instrument 5010 or the user local computing device 5020, to request a visit from a technician to improve the operation of the scientific instrument 5010, to order consumables or replacement parts associated with the scientific instrument 5010, or for other purposes. The service local computing device 5030 may allow remote control of the CPM, such as initiating the techniques disclosed herein, and/or to update the training of the trained models.

The remote computing device 5040 may be a computing device (e.g., in accordance with any of the embodiments of the computing device 4000 discussed herein) that is remote from the scientific instrument 5010 and/or from the user local computing device 5020. In some embodiments, the remote computing device 5040 may be included in a data-center or other large-scale server environment. In some embodiments, the remote computing device 5040 may include network-attached storage (e.g., as part of the storage device 5004). The remote computing device 5040 may store data generated by the scientific instrument 5010, perform analyses of the data generated by the scientific instrument 5010 (e.g., in accordance with programmed instructions), facilitate communication between the user local computing device 5020 and the scientific instrument 5010, and/or facilitate communication between the service local computing device 5030 and the scientific instrument 5010. The remote computing device may include instances of the trained models and may perform the image analysis and stage coordinate association as disclosed herein.

In some embodiments, one or more of the elements of the scientific instrument support system 5000 illustrated in FIG. 5 may not be present. Further, in some embodiments, multiple ones of various ones of the elements of the scientific instrument support system 5000 of FIG. 5 may be present. For example, a scientific instrument support system 5000 may include multiple user local computing devices 5020 (e.g., different user local computing devices 5020 associated with different users or in different locations). In another example, a scientific instrument support system 5000 may include multiple scientific instruments 5010, all in communication with service local computing device 5030 and/or a remote computing device 5040; in such an embodiment, the service local computing device 5030 may monitor these multiple scientific instruments 5010, and the service local computing device 5030 may cause updates or other information may be "broadcast" to multiple scientific instruments 5010 at the same time. Different ones of the scientific instruments 5010 in a scientific instrument support system 5000 may be located close to one another (e.g., in the same room) or farther from one another (e.g., on different floors of a building, in different buildings, in different cities, etc.). In some embodiments, a scientific instrument 5010 may be connected to an Internet-of-Things (IoT) stack that allows for command and control of the scientific instrument 5010 through a web-based application, a virtual or augmented reality application, a mobile application, and/or a desktop application. Any of these applications may be accessed by a user operating the user local computing device 5020 in communication with the scientific instrument 5010 by the intervening remote computing device 5040. In some embodiments, a scientific instrument 5010 may be sold by the manufacturer along with one or more associated user local computing devices 5020 as part of a local scientific instrument computing unit 5012.

In some embodiments, different ones of the scientific instruments 5010 included in a scientific instrument support system 5000 may be different types of scientific instruments 5010; for example, one scientific instrument 5010 may be an SEM, while another scientific instrument 5010 may be a dual-beam FIB-SEM. In some such embodiments, the remote computing device 5040 and/or the user local computing device 5020 may combine data from different types of scientific instruments 5010 included in a scientific instrument support system 5000.

Figure 6:
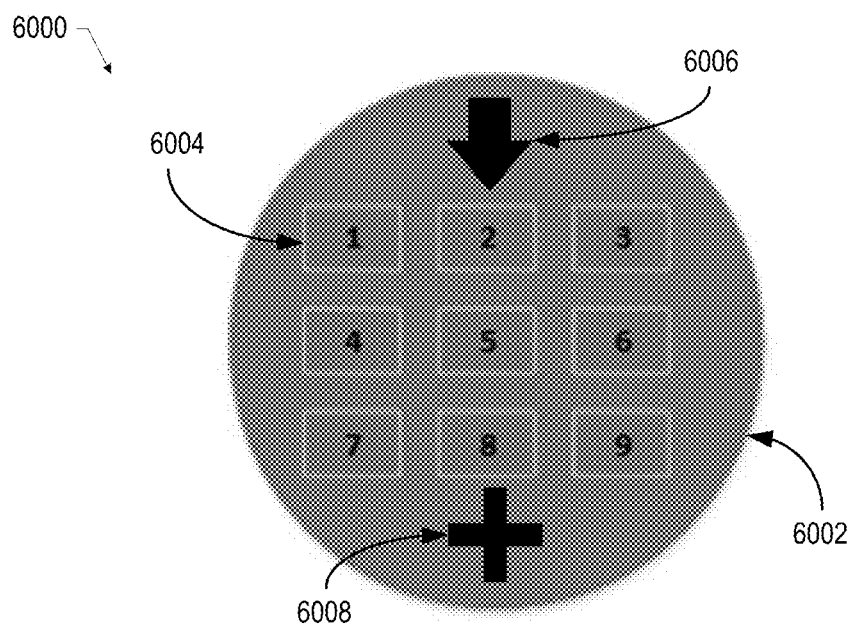
FIG. 6 is an example fixture for loading a plurality of samples into a CPM in accordance with an embodiment of the present disclosure.

FIG. 6 is an example fixture 6000 for loading a plurality of samples into a CPM in accordance with an embodiment of the present disclosure. The fixture 6000 includes a body 6002 that has pre-described sample locations 6004. The embodiment of FIG. 6 shows nine (9) preset sample locations, but such number of locations is not limiting, and any number of locations are within the scope of the present disclosure. Each sample location 6004 may be configured to accept a sample loaded onto fixture 6000 either manually or by robotic means, such as a robotic arm. Further, each sample location 6004 may include some means to hold a sample in place, such as a mechanical clip, a recess, or a non-slip type surface.

Fixture 6000 may also include marks 6006 and 6008 that are used at least in image analysis to orient the fixture 6000. While fixture 6000 shows only two marks, additional marks in different locations on the fixture are possible and contemplated herein. In some embodiments, mark 6006 is different from mark 6008 to help determine fixture orientation. In other embodiments, a third mark may be added to help identify orientation where all three marks are the same. In either embodiment, the marks may be large enough to be easily captured in a navcam image, e.g., a low resolution, wide field of view grey-scale image.

FIG. 7 is an example CPM 100 in accordance with an embodiment of the present disclosure. CPM 100 may be used to implement the techniques disclosed herein for identifying samples loaded on a fixture and associating each identified sample with stage coordinates, for example. Additional features as discussed above such as job file creation and updating will also be implemented on CPM 100 for execution of the techniques disclosed herein. In general, CPM 100 will have a fixture with samples loaded therein and an image of the fixture is captured and analyzed to identify samples and associate each sample with stage coordinates and sample locations on the fixture.

CPM 100 may at least include an emitter 102, an optical column 104, a camera 116, a stage 114, and a controller 118. The emitter 102 and optical column 104 may be housed in a column housing 106. In some embodiments, the column housing 106 and the components contained therein form a scanning electron microscope (SEM). While CPM 100 may be discussed as an SEM herein, other CPM types are also contemplated, such a focused ion beam (FIB) system, (scanning) transmission electron microscopes, and dual beam systems that contain both an SEM and a FIB. In general, the type of microscope is non-limiting, and even optical microscopes can fall within the range of instruments implementing the disclosed techniques. The emitter may be configured to emit a beam of charged particles 108, which may be conditioned and directed toward the stage 114 by optics 104.

The stage 114 and cameral 116 may be housed in a vacuum compatible housing 110 that includes a load-lock (not shown) for loading and unloading samples and/fixtures as discussed herein. The stage 114 may be a multi-axis stage capable of being moved in 3, 4 or 5 dimensions so that fixtures/samples loaded on the stage can be translated and rotated to align a sample with a charged particle beam (CPB), such as CPB 108. The camera 116 may be a simple detector capable of acquiring images of the stage and fixtures loaded thereon when the stage is under the CPB 108. In general, the camera 116 may be positioned to capture images coincident with images captured by the SEM column, but at a much lower resolution. The camera 116 may acquire low resolution grey-scale images at a wide field of view to ensure at least the entire fixture is captured in the image. In some embodiments, camera 116 may be the navcam, as discussed above, which is well known in the field of charged particle microscopy. It should be understood, however, that the type of camera used for camera 116 is non-limiting.

Controller 118 may be coupled to memory 120 and further coupled to control the various components of CPM 100, such as emitter 102, optics 104, stage 114 and camera 116. Data collected by CPM 100 may also be provided to controller 118 for analysis, control feedback or for providing to additional computing components connected to CPM 100 through one or more networks. In general, controller 118 may be configured as the hardware of FIG. 5 and include the logic of FIGS. 1A and 1B. Memory 120 may include operating instructions to implement the techniques disclosed herein and further may include one or more trained models for image analysis and providing stage coordinates for each sample identified through the image analysis.

The invention claimed is:

1. A method for determining sample location and associated stage coordinates by a microscope, the method comprising:
acquiring, with a navigation camera, an image of a plurality of samples loaded on a fixture, the image being of low resolution at a field of view that includes the fixture and all samples of the plurality of samples;
analyzing the image with a trained model to identify the plurality of samples;
based on the analysis, associating each sample with a location on the fixture;
based on the location on the fixture of each sample, associating separate stage coordinate information with each sample of the plurality of samples loaded on the fixture; and translating a stage holding the fixture to first stage coordinates based on the associated stage coordinate information of a first sample of the plurality of samples.

2. The method of claim 1, further including:
associating a process with a sample at the first stage coordinate information; and
executing the process when the stage is translated to the first stage coordinates.

3. The method of claim 1, further including:
receiving a job file at the microscope or by a server coupled to the microscope, the job file including sample ID, sample number on the fixture, and process information, wherein the tool; and
accessing the job file to associate the process with the sample.

4. The method of claim 1, wherein analyzing the image with a trained model to identify the plurality of samples includes:
segmenting the image with the trained model; and
identifying each sample of the plurality of samples based on the segmentation.

5. The method of claim 4, further including:
determining an orientation of the fixture based on marks on the fixture, wherein the marks are arranged to show orientation of the fixture;
associating each sample with a location on the fixture; and
associating each sample with a stage location and associated stage coordinate information.

6. The method of claim 5, wherein the fixture includes a plurality of the marks arranged across the fixture.

7. The method of claim 1, wherein the navigation camera is arranged to view a location that is coincident with a viewing location of optics of the microscope.

8. The method of claim 7, wherein the microscope is a charged particle microscope and the optics include charged particle optics.

9. The method of claim 1, further including:
translating the stage holding the fixture to second stage coordinates after performing a process with the stage at the first stage coordinates.

10. The method of claim 9, wherein the process includes acquiring a scanning electron image.

11. A method comprising:
loading a plurality of samples onto a fixture, the fixture including a plurality of fixture locations, wherein each fixture location can accept one sample, and wherein each fixture location is at known location on the fixture and have associated identifiers, and wherein the fixture includes markers that orient the fixture locations;
updating a work file to associate each sample of the plurality of samples with a fixture location, where each sample has an associated sample ID;
loading the fixture into a charged particle microscope (CPM), the fixture mounted on a stage of the CPM and the stage moves so that the fixture is in a location that is coincident with a charged particle beam and a navigation camera (navcam);
acquiring an image of the fixture with the navcam;
providing the image to a trained model for analysis;
receiving, from the trained model, stage coordinate information for each sample loaded on the fixture;
updating the work file to associate the stage coordinate information for each sample; and
initiating the work file to process each sample, wherein the work file associates a process with each sample of the plurality of samples.

12. The method of claim 11, wherein the trained model is a machine learning model trained to identify samples and associate each sample with a stage location.

13. The method of claim 11, wherein each sample ID identifies a lot number, a wafer number and a die number with which the sample is associated.

14. The method of claim 11, further including:
receiving, form the trained model, sample identification for each fixture location of the plurality of fixture locations.

15. The method of claim 11, further including:
generating a work file for a plurality of samples, the work file at least includes the sample ID and the process associated with each sample of the plurality of samples.

16. The method of claim 11, wherein the stage is a multi-axis stage.

17. The method of claim 11, wherein the fixture includes a plurality of marks for determining orientation of the fixture on the stage.

18. The method of claim 11, wherein the CPM includes at least a scanning electron microscope (SEM) column for performing the process for each sample of the plurality of samples.

19. The method of claim 18, wherein a process can include imaging the sample with the SEM column at an energy level, field of view and magnification as indicated in the work file.

20. The method of claim 11, wherein each sample is a semiconductor sample.

* * * * *